(12) United States Patent
Katase et al.

(10) Patent No.: US 9,585,287 B2
(45) Date of Patent: Feb. 28, 2017

(54) ELECTRONIC COMPONENT, ELECTRONIC APPARATUS, AND METHOD FOR MANUFACTURING THE ELECTRONIC COMPONENT

(71) Applicant: CANON KABUSHIKI KAISHA, Tokyo (JP)

(72) Inventors: Yu Katase, Kawasaki (JP); Fujio Ito, Yokohama (JP); Tadashi Kosaka, Atsugi (JP); Koji Tsuduki, Kawasaki (JP); Ichiro Kataoka, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 150 days.

(21) Appl. No.: 14/520,284

(22) Filed: Oct. 21, 2014

(65) Prior Publication Data

US 2015/0116946 A1    Apr. 30, 2015

(30) Foreign Application Priority Data

Oct. 25, 2013  (JP) ................................ 2013-222521

(51) Int. Cl.
*H05K 7/20* (2006.01)
*H01L 23/36* (2006.01)
(Continued)

(52) U.S. Cl.
CPC ......... *H05K 7/2039* (2013.01); *H01L 23/055* (2013.01); *H01L 23/36* (2013.01);
(Continued)

(58) Field of Classification Search
CPC ..... H05K 7/2039; H01L 23/055; H01L 23/36; H01L 23/49822; H01L 2224/73265; H01L 2224/48091
(Continued)

(56) References Cited

U.S. PATENT DOCUMENTS 6,526,653 B1 * 3/2003 Glenn ................... H01L 23/04
174/521
6,724,072 B2 * 4/2004 Ochiai ................. H01L 21/565
257/667

(Continued)

FOREIGN PATENT DOCUMENTS

CN        1419286 A      5/2003
JP     H04-123462 A      4/1992
(Continued)

*Primary Examiner* — Courtney Smith
*Assistant Examiner* — Matt Dhillon
(74) *Attorney, Agent, or Firm* — Canon U.S.A. Inc., IP Division (57) ABSTRACT

An electronic component includes an electronic device and a container containing the electronic device. The container includes a base having a first region to which the electronic device is secured and a second region around the first region, a cover facing the electronic device across a space, and a frame secured to the second region to surround the space. The frame includes a first member and a second member having a thermal conductivity lower than those of the first member and the base. The first member has first and second portions on inner and outer edge sides of the frame, respectively, on both sides of an outer edge of the base. The second member is located between the cover and the first member. A shortest distance between the first member and the base is smaller than that between the first member and the cover.

20 Claims, 7 Drawing Sheets

(51) Int. Cl.
*H01L 23/055* (2006.01)
*H01L 23/498* (2006.01)

(52) U.S. Cl.
CPC .............. *H01L 23/49822* (2013.01); *H01L 2224/48091* (2013.01); *H01L 2224/73265* (2013.01)

(58) Field of Classification Search
USPC ................ 361/679.01, 707, 713; 348/294
See application file for complete search history.

(56) References Cited

U.S. PATENT DOCUMENTS

| | | | | |
|---|---|---|---|---|
| 6,759,266 | B1* | 7/2004 | Hoffman | H01L 23/10 257/E23.193 |
| 7,145,253 | B1* | 12/2006 | Kim | B81C 1/00333 257/417 |
| 7,629,674 | B1* | 12/2009 | Foster | H01L 21/56 257/659 |
| 7,786,429 | B2* | 8/2010 | Glenn | H01L 24/97 250/216 |
| 8,445,984 | B2* | 5/2013 | Haskett | B81B 7/0067 257/433 |
| 9,155,212 | B2* | 10/2015 | Tsuduki | H05K 5/0091 |
| 2009/0046183 | A1* | 2/2009 | Nishida | H01L 21/6835 348/294 |
| 2011/0089564 | A1* | 4/2011 | Oh | H01L 23/13 257/738 |
| 2011/0205413 | A1* | 8/2011 | Suzuki | H01L 27/14618 348/294 |
| 2012/0112042 | A1* | 5/2012 | Webster | G02B 7/02 250/208.1 |
| 2014/0339668 | A1 | 11/2014 | Arima et al. | |

FOREIGN PATENT DOCUMENTS

| | | |
|---|---|---|
| JP | 2004-165181 A | 6/2004 |
| JP | 2008-245244 A | 10/2008 |
| JP | 2011-176224 A | 9/2011 |
| WO | 2013118501 A1 | 8/2013 |

* cited by examiner

ELECTRONIC COMPONENT, ELECTRONIC APPARATUS, AND METHOD FOR MANUFACTURING THE ELECTRONIC COMPONENT

BACKGROUND OF THE INVENTION

Field of the Invention

The present invention relates to a technique for mounting an electronic device.

Description of the Related Art

With increased functionality of electronic devices such as image pickup devices in recent years, the amount of heat generated by the electronic devices has increased. Therefore, in an electronic component having a container (package) that contains an electronic device, the container is required to have high heat dissipation performance. Japanese Patent Laid-Open No. 2008-245244 proposes an image pickup element package made of a material having good heat dissipation properties. Japanese Patent Laid-Open No. 2011-176224 proposes a solid-state image pickup apparatus having a resin package and a metal or ceramic substrate, but does not discuss heat dissipation.

When a container is formed by combining a member generally having a high thermal conductivity, such as a metal or ceramic member, with a member generally having a low thermal conductivity, such as a resin member, the heat dissipation performance of the container may be degraded if the member having a low thermal conductivity is positioned in the heat dissipation path.

The present invention provides an electronic component capable of efficiently dissipating heat generated by an electronic device.

SUMMARY OF THE INVENTION

A first aspect of the present invention provides an electronic component that includes an electronic device and a container configured to contain the electronic device. The container includes a base having a first region to which the electronic device is secured and a second region around the first region, a cover facing the electronic device, and a frame secured to the second region to surround a space between the cover and the first region. The frame includes a first member and a second member having a thermal conductivity lower than those of the first member and the base. The first member has a first portion located on a side of an inner edge of the frame than an outer edge of the base, and a second portion located on a side of an outer edge of the frame than the outer edge of the base. A length of the second portion is longer than a length of the first portion in a direction from the inner edge of the frame to the outer edge of the frame. The second member is located between the cover and the first member. A shortest distance between the first member and the base is smaller than a shortest distance between the first member and the cover.

Further features of the present invention will become apparent from the following description of exemplary embodiments with reference to the attached drawings.

DESCRIPTION OF THE EMBODIMENTS

Embodiments of the present invention will now be described with reference to the drawings. In the following description and drawings, components that are common to some of the drawings are denoted by the same reference numerals. Such common components may be described by referring to a plurality of drawings. The description of components denoted by the same reference numerals may be omitted.

Figure 1A:
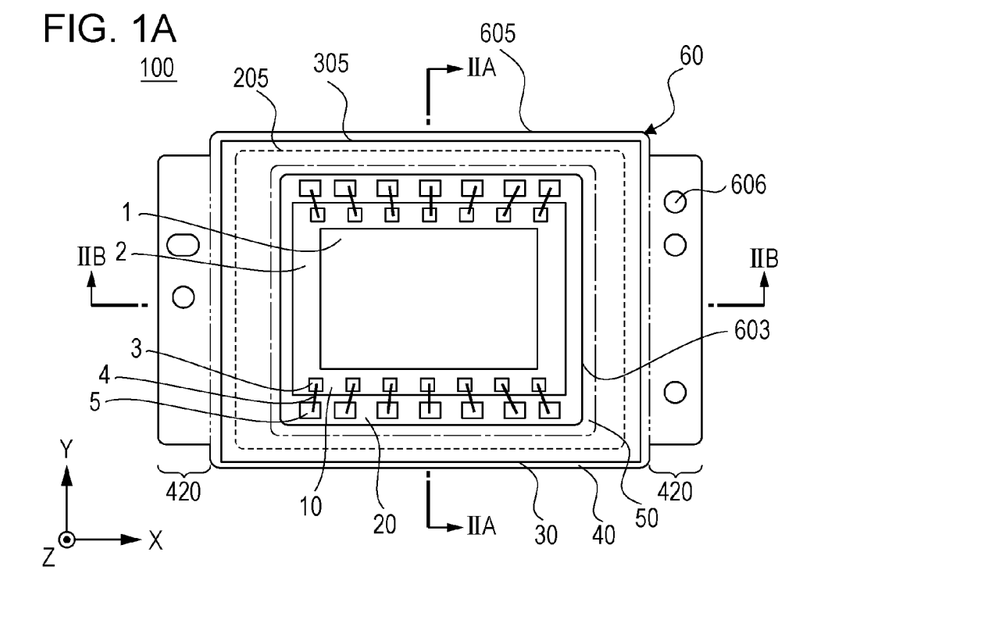
FIGS. 1A and 1B are schematic plan views of an electronic component according to a first embodiment of the present invention.
Figure 1B:
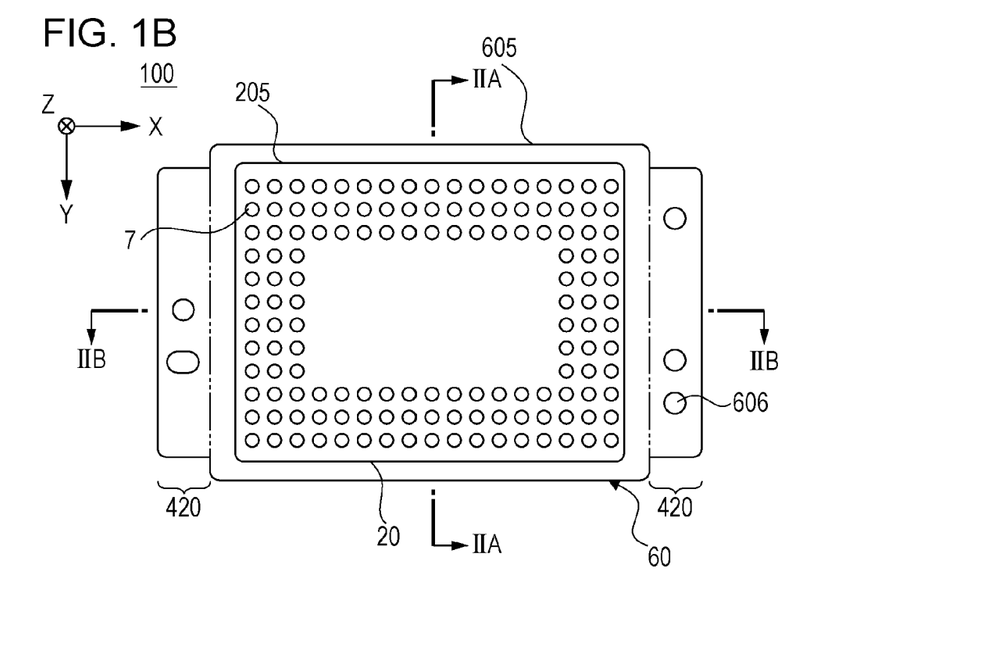
Figure 2A:
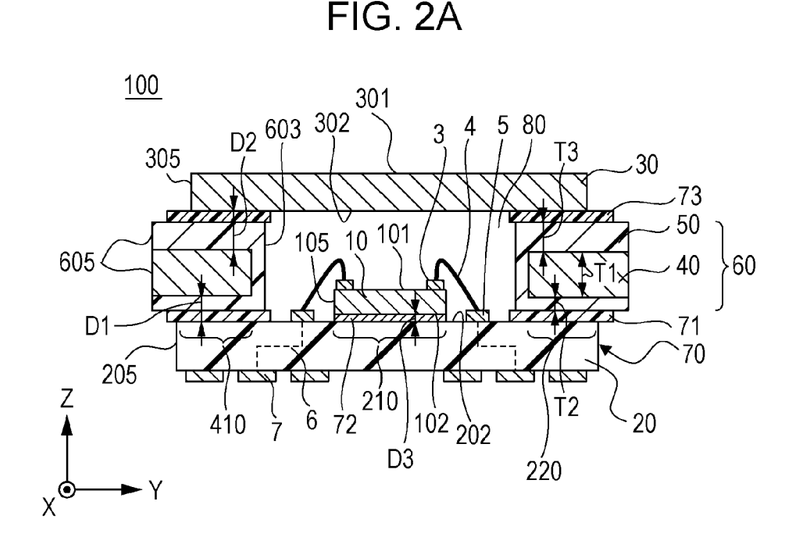
FIGS. 2A and 2B are schematic cross-sectional views of the electronic component according to the first embodiment.
Figure 2B:
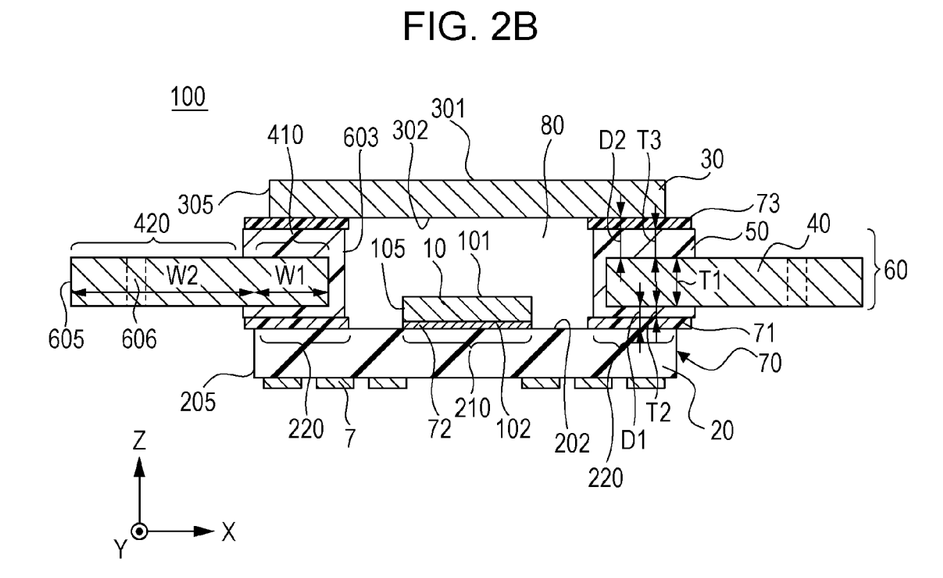

As a first embodiment of the present invention, an example of an electronic component 100 will be described. FIG. 1A is a schematic plan view of the electronic component 100 as viewed from the front, and FIG. 1B is a schematic plan view of the electronic component 100 as viewed from the back. FIGS. 2A and 2B are schematic cross-sectional views of the electronic component 100. FIG. 2A is a cross-sectional view of the electronic component 100 taken along line IIA-IIA of FIGS. 1A and 1B, and FIG. 2B is a cross-sectional view of the electronic component 100 taken along line IIB-IIB of FIGS. 1A and 1B. In the following description, the same components are denoted by the same reference numerals, and the description will be made by referring to a plurality of drawings. Note that X, Y, and Z in the drawings indicate the X-direction, the Y-direction, and the X-direction, respectively.

The electronic component 100 includes an electronic device 10 and a container 70 containing the electronic device 10. The container 70 mainly includes a base 20, a cover 30, and a frame 60. Although the details will be described below, the frame 60 includes a high thermal conductivity member 40 (first member) and a low thermal conductivity member 50 (second member) having a thermal conductivity lower than that of the high thermal conductivity member 40.

In the container 70, the base 20 and the frame 60 can function as a mounting member for primary mounting of the electronic component 100. The cover 30 can function as an optical member. The electronic device 10 is secured to the base 20. The cover 30 is secured to the base 20, with the frame 60 interposed therebetween. The cover 30 faces the electronic device 10 across an inner space 80. The frame 60 surrounds the inner space 80 between the cover 30 and the electronic device 10.

The X-direction and the Y-direction are directions parallel to a front surface 101 of the electronic device 10 facing the cover 30, a back surface 102 of the electronic device 10 opposite the front surface 101 and secured to the base 20, an outer surface 301 of the cover 30, and an inner surface 302 of the cover 30. The Z-direction is a direction perpendicular to the front surface 101, the back surface 102, the outer surface 301, and the inner surface 302. Typically, the electronic device 10 and the electronic component 100 are rectangular in the X-direction and the Y-direction. The electronic device 10 and the electronic component 100 are smaller in dimension in the Z-direction than in the X-direction and the Y-direction, and have a flat plate-like shape. For convenience, a dimension in the Z-direction will hereinafter be referred to as either thickness or height.

In the X-direction and the Y-direction, an outer edge of the electronic component 100 is defined by an outer edge 205 of the base 20, an outer edge 605 of the frame 60, and an outer edge 305 of the cover 30. The frame 60 has an inner edge 603 as well as the outer edge 605.

The electronic device 10 is not limited to any particular type, but is typically an optical device. The electronic device 10 of the present embodiment has a main region 1 and a sub-region 2. Typically, the main region 1 is located in the center of the electronic device 10, and the sub-region 2 is located around the main region 1. If the electronic device 10 is an image pickup device, such as a charge-coupled device (CCD) image sensor or a complementary metal oxide semiconductor (CMOS) image sensor, the main region 1 is an image pickup region. If the electronic device 10 is a display device, such as a liquid crystal display or an electroluminescent (EL) display, the main region 1 is a display region. If the electronic device 10 is an image pickup device, the front surface 101, which is a surface of the electronic device 10 facing the cover 30, serves as a light incidence surface. The light incidence surface can be formed by the front-most layer of a multilayer film on a semiconductor substrate having a light receiving surface. The multilayer film includes a layer having an optical function, such as a color filter layer, a microlens layer, an antireflection layer, or a light shielding layer; a layer having a mechanical function, such as a planarizing layer; and a layer having a chemical function, such as a passivation layer. The sub-region 2 is provided with a drive circuit for driving the main region 1, and a signal processing circuit for processing signals from the main region 1 (or signals to the main region 1). If the electronic device 10 is a semiconductor device, it is easy to monolithically form these circuits. The sub-region 2 is also provided with electrodes 3 (electrode pads) for communication of signals to and from the outside.

The base 20 has a flat plate-like shape. The base 20 can be formed, for example, by metal molding, cutting, or stacking a plurality of plates. The base 20 may be a conductor, such as a metal plate, but is preferably an insulator to ensure insulation between inner terminals 5 and outer terminals 7 (described below). The base 20 may be a flexible substrate, such as a polyimide substrate, but is preferably a rigid substrate, such as a glass epoxy substrate, a composite substrate, a glass composite substrate, a Bakelite substrate, or a ceramic substrate. It is particularly preferable that the base 20 be a ceramic substrate and that a ceramic laminated body be used as the base 20. The ceramic material may be silicon carbide, aluminum nitride, sapphire, alumina, silicon nitride, cermet, yttria, mullite, forsterite, cordierite, zirconia, or steatite. The base 20 formed by a ceramic laminated body can have a high thermal conductivity. The thermal conductivity of the base 20 is preferably 1.0 W/m·K or more, and is more preferably 10 W/m·K or more.

The base 20 has a central region 210 (first region) to which the electronic device 10 is secured, and a peripheral region 220 (second region) around the central region 210. A region between the central region 210 and the peripheral region 220 will be referred to as an intermediate region. The central region 210 is an orthogonal projection region of the electronic device 10, and overlaps the electronic device 10 on the base 20 in the Z-direction. The peripheral region 220 is an orthogonal projection region of the frame 60, and overlaps the frame 60 on the base 20 in the Z-direction. As illustrated in FIGS. 2A and 2B, the electronic device 10 is secured to the central region 210 of the base 20, with a bonding member 72 interposed between the central region 210 and the back surface 102 of the electronic device 10. The bonding member 72 may be either a conductor or an insulator. The bonding member 72 may have a high thermal conductivity, and may contain metal particles. The thermal conductivity of the bonding member 72 may be 0.1 W/m·K or more.

The container 70 has the inner terminals 5 facing the interior (inner space 80) of the container 70, and the outer terminals 7 facing the exterior of the container 70. The inner terminals 5 and the outer terminals 7 are electrically connected to each other via embedded portions 6 embedded as internal wiring in the base 20. The inner terminals 5 and the outer terminals 7 are disposed on the surfaces of the base 20 and secured to the base 20.

A plurality of inner terminals 5 are arranged to form an inner terminal group. In the present embodiment, two inner terminal groups, each formed by seven inner terminals 5 arranged in a row in the X-direction, are arranged in two rows in the Y-direction. A plurality of outer terminals 7 are arranged to form an outer terminal group. In the present embodiment, outer terminal groups are arranged in rows and columns in the X- and Y-directions on the back side of the base 20. The inner terminals 5 and the outer terminals 7 do not necessarily need to be arranged in this manner, and may be arranged in any configuration. As illustrated in FIGS. 2A and 2B, a surface where the inner terminals 5 are provided is defined as a reference surface 202. In the present embodiment, the electronic device 10 and the frame 60 are secured to the reference surface 202 where the inner terminals 5 are arranged. The inner terminals 5 are provided on the intermediate region between the central region 210 and the peripheral region 220 of the base 20.

In the electronic component 100, the electrodes 3 on the electronic device 10 are electrically connected to the respective inner terminals 5 in the container 70 via respective connection conductors 4. In the present embodiment, the electrodes 3 and the inner terminals 5 are connected by wire bonding, and the connection conductors 4 are metal wires (bonding wires). Alternatively, the electrodes 3 and the inner terminals 5 may be flip-chip connected to each other. In this case, the electrodes 3 are disposed on the back surface 102 of the electronic device 10, and the inner terminals 5 and the connection conductors 4 are disposed in the central region 210.

Although the outer terminals 7 form a land grid array (LGA) in the present embodiment, the outer terminals 7 may form a pin grid array (PGA), a ball grid array (BGA), or a leadless chip carrier (LCC). In such a configuration, the outer terminals 7 may be located in a region of orthogonal projection from the cover 30 to the base 20. The region of orthogonal projection is a region through which a set of lines perpendicular to the principal plane of the cover 30 passes. That is, the outer terminals 7 overlap the cover 30 in the Z-direction. Some of the outer terminals 7 may be located in a region of orthogonal projection from the electronic device 10 to the base 20. The inner terminals 5, the embedded portions 6, and the outer terminals 7 may be integrated into a single unit using a lead frame. In the configuration using a lead frame, a plurality of outer terminals 7 are located outside the region of orthogonal projection from the cover 30 to the base 20. The electronic component 100 is secured to a wiring member, such as a printed wiring board, while the outer terminals 7 are electrically connected to connection terminals on the wiring member. The outer terminals 7 located in the region of orthogonal projection from the cover 30 to the base 20 can be electrically connected to an external circuit by reflow soldering using a solder paste. The electronic component 100 is thus secondary-mounted on the wiring member to form an electronic module. The electronic component 100 may be surface-mounted on the wiring member. The electronic module is mounted into a housing to form an electronic apparatus.

The cover 30 facing the electronic device 10 has the function of protecting the electronic device 10. If the electronic device 10 is an image pickup device or a display device dealing with light, the cover 30 needs to be transparent to the light (typically visible light). In this case, the material of the cover 30 may be plastic; glass, such as quartz glass or borosilicate glass; or a single-crystal material, such as single-crystal quartz, sapphire, or diamond. The surface of the cover 30 may be coated with an antireflection coating or an infrared cut coating.

The frame 60 is formed to include a space between the central region 210 and the cover 30. This space is part of the inner space 80. The inner edge 603 is a surface of the frame 60 facing and surrounding the inner space 80. The frame 60 may either surround or not surround the electronic device 10. Surrounding the inner space 80 and the electronic device 10 with the frame 60 means that, in the X-Y direction, the frame 60 faces the inner space 80 and the electronic device 10 along 90% of the entire perimeter of the inner edge 603 of the frame 60. Therefore, when the frame 60 surrounds the electronic device 10, 90% of the entire perimeter of a side face 105 of the electronic device 10 may face the inner edge 603 of the frame 60 in the X-Y direction. The frame 60 has the function of defining the distance between the electronic device 10 and the cover 30. The frame 60 is secured to the peripheral region 220 of the base 20. In the present embodiment, the frame 60 is secured to the base 20 by a bonding member 71.

The frame 60 includes the high thermal conductivity member 40 (first member) and the low thermal conductivity member 50 (second member) having a thermal conductivity lower than that of the high thermal conductivity member 40. The thermal conductivity of the high thermal conductivity member 40 (first member) included in the frame 60 is higher than that of the low thermal conductivity member 50 (second member) included in the frame 60. The thermal conductivity of the base 20 may also be higher than that of the low thermal conductivity member 50. The thermal conductivity of the high thermal conductivity member 40 is preferably 1.0 W/m·K or more, and is more preferably 10 W/m·K or more. The thermal conductivity of the low thermal conductivity member 50 is, for example, 10 W/m·K or less, and is typically 1 W/m·K or less.

To ensure the strength of the frame 60, a material with a high stiffness (Young's modulus) may be used to form the high thermal conductivity member 40. For example, the Young's modulus of the high thermal conductivity member 40 is 50 GPa or more, and is preferably 100 GPa or more. Ceramic or metal can be used as the material of the high thermal conductivity member 40, and it is particularly preferable that the high thermal conductivity member 40 be made of metal. When attention is given to the material of the member included in the frame 60, the high thermal conductivity member 40 made of metal can be referred to as a metal member, and the high thermal conductivity member 40 made of ceramic can be referred to as a ceramic member. Metal materials suitable for forming the high thermal conductivity member 40 include aluminum, aluminum alloy, copper, copper alloy, and iron alloy. An iron alloy containing chromium, nickel, and cobalt, such as stainless steel, is particularly suitable for forming the high thermal conductivity member 40. For example, the high thermal conductivity member 40 may be made of SUS 430, which is a ferritic stainless steel, or may be made of SUS 304, 42 alloy, or Kovar, which is an austenite stainless steel.

The position of the high thermal conductivity member 40 will be described. As illustrated in FIGS. 2A and 2B, the high thermal conductivity member 40 included in the frame 60 has a joint portion 410 (first portion) and an extended portion 420 (second portion). In the direction from the inner edge 603 of the frame 60 toward the outer edge 605 of the frame 60, the joint portion 410 is located on a side of the inner edge 603 of the frame 60 than the outer edge 205 of the base 20. The joint portion 410 is joined to the peripheral region 220 of the base 20 and the cover 30. The extended portion 420 is located on a side of the outer edge 605 of the frame 60 than the outer edge 205 of the base 20. That is, the high thermal conductivity member 40 can be imaginarily divided into the joint portion 410 closer to the inner edge 603 and the extended portion 420 closer to the outer edge 605 in a boundary corresponding to the outer edge 205 of the base 20. In the extended portion 420 of the frame 60 exposed to the outer space, a surface which defines the outer edge of the electronic component 100 is the outer edge 605 of the frame 60. Of the two surfaces connecting the inner edge 603 and the outer edge 605 of the frame 60, the surface adjacent to the base 20 is referred to as a lower surface, and the surface adjacent to the cover 30 is referred to as an upper surface.

The length of the joint portion 410 in the direction from the inner edge 603 of the frame 60 toward the outer edge 605 of the frame 60 (X-Y direction) is defined as a width W1 of the joint portion 410. The length of the extended portion 420 in the direction from the inner edge 603 of the frame 60 toward the outer edge 605 of the frame 60 (X-Y direction) is defined as a width W2 of the extended portion 420. The width W2 of the extended portion 420 may be larger than the width W1 of the joint portion 410. FIG. 2B illustrates the extended portion 420 having the width W2 larger than the width W1 of the joint portion 410. Although the high thermal conductivity member 40 has the extended portion 420 as well as the joint portion 410 in FIG. 2A, the width of the extended portion 420 is smaller than that of the joint portion 410. The extended portion 420 has through holes 606. The through holes 606 may be used as holes for screwing to a housing of an electronic apparatus, or as holes for positioning.

The low thermal conductivity member 50 is located between the cover 30 and the high thermal conductivity member 40. The stiffness (Young's modulus) of the low thermal conductivity member 50 may be lower than the Young's modulus of the high thermal conductivity member 40. When attention is given to the stiffness (Young's modulus) of the members included in the frame 60, the high thermal conductivity member 40 can be referred to as a high-stiffness member and the low thermal conductivity member 50 can be referred to as a low-stiffness member. For example, the Young's modulus of the low thermal conductivity member 50 is preferably equal to or less than ½ of that of the high thermal conductivity member 40, and is more preferably equal to or less than 1/10 of that of the high thermal conductivity member 40. For example, the Young's modulus of the low thermal conductivity member 50 is 50 GPa or less, preferably 10 GPa or less, and more preferably 1 GPa or less. The stiffness (Young's modulus) of the low thermal conductivity member 50 may be lower than that of the cover 30.

An organic material generally having a low thermal conductivity may be used as the material of the low thermal conductivity member 50. For chemical stability and better workability, a resin material may be used as the material of the low thermal conductivity member 50. When attention is given to the material of the member included in the frame 60, the low thermal conductivity member 50 made of resin may be referred to as a resin member. Examples of the resin material suitable for forming the low thermal conductivity member 50 include epoxy resin, acrylic resin, silicone resin, and vinyl resin. Examples of the organic material include a dried solidified type which is dried and solidified by evaporation of a solvent, a chemically reacted type which is cured by a chemical reaction such as photo- or thermal polymerization of molecules, and a hot-melt type which is solidified by solidification of a molten material. Typically, a photo-curable resin cured by ultraviolet light or visible light, or a thermosetting resin cured by heat may be used. For moisture resistance for the electronic device 10, a thermosetting epoxy resin containing a sufficient amount of glass filler may be used.

The high thermal conductivity member 40 provided as described above serves as a heat dissipating member that dissipates heat generated by the electronic device 10 to the outside. That is, heat generated by the electronic device 10 is conducted, via the base 20 having a thermal conductivity as high as that of the high thermal conductivity member 40, to the joint portion 410 of the high thermal conductivity member 40 and diffused to the extended portion 420 of the high thermal conductivity member 40. The heat is thus dissipated from the extended portion 420 to the outside.

One of the functions that the low thermal conductivity member 50 can have is heat insulation. If heat conducted to the joint portion 410 of the high thermal conductivity member 40 is further conducted to the cover 30, the efficiency of heat dissipation in the extended portion 420 is degraded. If the heat is diffused over the cover 30 and the temperature of the cover 30 is increased, the level of stress caused by thermal expansion of the cover 30 increases. With the low thermal conductivity member 50 between the cover 30 and the high thermal conductivity member 40, it is possible to suppress diffusion of heat from the joint portion 410 to the cover 30.

One of the functions that the low thermal conductivity member 50 serving as a low-stiffness member can have is shock absorption. A substantial amount of stress is generated between the cover 30 and the high thermal conductivity member 40 due to at least one of (1) the difference in thermal expansion coefficient, (2) the difference in temperature, and (3) the difference in shape between the cover 30 and the high thermal conductivity member 40. The low thermal conductivity member 50 serving as a low-stiffness member having a Young's modulus lower than that of the high thermal conductivity member 40 can function as a shock absorbing member that deforms to reduce the stress.

One of the functions that the low thermal conductivity member 50 serving as a resin member can have is to improve flatness of both the lower and upper surfaces of the frame 60. The lower surface of the frame 60 forms a bonding surface between the base 20 and the frame 60, and the upper surface of the frame 60 forms a bonding surface between the cover 30 and the frame 60. When the high thermal conductivity member 40 is a metal member and if the metal member, which has a high stiffness, suffers substantial warpage or distortion, the metal member needs to go through a very complicated process, such as cutting or polishing, to correct the warpage or distortion and improve the flatness. On the other hand, the surface shape of a resin member can be easily controlled. That is, a flat surface can be easily formed in the resin member by melting or molding using a metal mold having a flat surface. Thus, the resin member can function as a flattening member for flattening the bonding surfaces of the frame 60.

The position of the high thermal conductivity member 40 with respect to the other components will be described in detail. FIGS. 2A and 2B show a distance D1 between the high thermal conductivity member 40 and the base 20, a distance D2 between the high thermal conductivity member 40 and the cover 30, and a distance D3 between the electronic device 10 and the base 20. In the following description, the "distance" between two components refers to the shortest distance between them. More specifically, the distance is the shortest distance from a first surface of one of the two components to a second surface of the other of the two components, the first surface facing the other of the two components and the second surface facing the one of the two components.

The distance D1 is specifically the distance between the joint portion 410 and the peripheral region 220 of the base 20. The distance D1 may be equal to the sum of a thickness T2 of the low thermal conductivity member 50 between the high thermal conductivity member 40 and the base 20 and the thickness of the bonding member 71 between the high thermal conductivity member 40 and the base 20, but one of the low thermal conductivity member 50 and the bonding member 71 between the high thermal conductivity member 40 and the base 20 may not be present.

The distance D2 is specifically the distance between the joint portion 410 and a part of the cover 30 overlapping the frame 60. The distance D2 may be equal to the sum of a thickness T3 of the low thermal conductivity member 50 between the high thermal conductivity member 40 and the cover 30 and the thickness of a bonding member 73 between the high thermal conductivity member 40 and the cover 30, but one of the low thermal conductivity member 50 and the bonding member 73 between the high thermal conductivity member 40 and the cover 30 may not be present.

The distance D3 is specifically the distance between the electronic device 10 and the central region 210 of the base 20. The distance D3 may be the thickness of the bonding member 72 between the electronic device 10 and the base 20, but the bonding member 72 may not be present.

To effectively achieve the heat dissipating effect of the high thermal conductivity member 40 and the heat insulating effect of the low thermal conductivity member 50, the frame 60 is provided such that the relationship D1<D2 is satisfied. That is, by making the distance D1 between the high thermal conductivity member 40 and the base 20 smaller to make the high thermal conductivity member 40 closer to the base 20, the conductivity of heat from the base 20 to the high thermal conductivity member 40 can be made higher than that in the case of D1≥D2. On the other hand, by making the distance D2 between the high thermal conductivity member 40 and the cover 30 larger to make the high thermal conductivity member 40 away from the cover 30, the level of heat insulation between the high thermal conductivity member 40 and the cover 30 can be made higher that in the case of D1≥D2.

The relationship D3<D1 may also be satisfied. By making the distance D3 between the electronic device 10 and the base 20 smaller to make the electronic device 10 closer to the base 20, the conductivity of heat from the electronic device 10 to the base 20 can be made higher than that in the case of D3≥D1. To satisfy D3<D1, the low thermal conductivity member 50 may not extend between the electronic device 10 and the central region 210 of the base 20.

FIGS. 2A and 2B show a thickness T1 which is the length of the joint portion 410 of the high thermal conductivity member 40 in the Z-direction. FIGS. 2A and 2B also show the thickness T2 which is the length of the low thermal conductivity member 50 between the high thermal conductivity member 40 and the base 20 in the Z-direction, and the thickness T3 which is the length of the low thermal conductivity member 50 between the high thermal conductivity member 40 and the cover 30. At least one of T1>T2, T1>T3, and T2<T3 may be satisfied. Satisfying T2<T3 is effective in satisfying the relationship D1<D2.

The thickness T1 may be in the 0.2 mm to 2 mm range. If the thickness T1 of the high thermal conductivity member 40 is 0.2 mm or more, it is possible not only to ensure stiffness necessary for securing, for example, to a housing of an electronic apparatus, but also to ensure sufficient heat dissipation performance. However, if the thickness T1 of the high thermal conductivity member 40 exceeds 2 mm, the container 70 becomes larger than necessary. The length (thickness) of the extended portion 420 of the frame 60 in the Z-direction may be larger than the thickness T1 of the joint portion 410. However, the thickness of the extended portion 420 may not exceed the length from the back surface of the base 20 to the outer surface 301 of the cover 30. That is, the thickness of the extended portion 420 may not exceed the thickness of the container 70.

The thickness T2 of the low thermal conductivity member 50 between the high thermal conductivity member 40 and the base 20 is preferably 200 μm or less, and more preferably 70 μm or less. If the thickness T2 of the low thermal conductivity member 50 is 70 μm or less, it is possible to reduce interference with the conduction of heat from the base 20 to the high thermal conductivity member 40.

The thickness T3 of the low thermal conductivity member 50 between the high thermal conductivity member 40 and the cover 30 may be in the 70 μm to 2 mm range. If the thickness T3 of the low thermal conductivity member 50 is 70 μm or more, the low thermal conductivity member 50 can fully function as a shock absorber for stress generated by thermal expansion or contraction resulting from temperature changes, which are associated with the heating process during manufacture or environmental changes during use. Therefore, it is possible reduce stress loading on the bonding surface and achieve high bonding reliability. The function of the low thermal conductivity member 50 as a shock absorber is improved as the thickness T3 increases. To avoid an excessive increase in the size of the container 70, however, the thickness T3 may be set to 200 μm or less. The thickness T3 of the low thermal conductivity member 50 may be larger than the thickness of the bonding member 73. That is, T3>D2−T3 may be satisfied.

The thickness of the bonding member 72 corresponding to the distance D3 is preferably 50 μm or less, and more preferably 20 μm or less. If the thermal conductivity of the bonding member 72 is 0.1 W/m·K or more and the thickness of the bonding member 72 is 50 μm or less, it is possible to ensure very good heat conduction from the electronic device 10 to the base 20. The thermal conductivity of the bonding member 71 may be 0.1 W/m·K or more. The thickness of the bonding member 71 may be in the 20 μm to 200 μm range. The thickness of the bonding member 73 may be in the 10 μm to 100 μm range, and is preferably 50 μm or less. Since the presence of the low thermal conductivity member 50 provides advantages in terms of heat insulation and adhesiveness, the thickness of the bonding member 73 can be made smaller than that of the bonding member 71. By making the thickness of the bonding member 73 smaller, it is possible to improve airtightness.

When at least part of the inner edge 603 is formed by the low thermal conductivity member 50, it is possible to reduce heat dissipation from the high thermal conductivity member 40 to the inner space 80 and improve the efficiency of heat dissipation via the extended portion 420. Also, it is possible to suppress an increase in the temperature of the inner space 80. It is more preferable that the entire perimeter of the inner edge 603 be formed by the low thermal conductivity member 50.

When the high thermal conductivity member 40 is made of metal, if the metal is exposed to the inner edge 603, the reflection of light on the inner edge 603 affects the quality of a picked-up image or a display image. Therefore, the inner edge 603 may be made of a black or gray material that absorbs visible light. When the inner edge 603 is formed by the low thermal conductivity member 50 of black or gray color, the reflection of light on the inner edge 603 of the frame 60 can be reduced. Since the entry of light reflected off the inner edge 603 of the frame 60 into the electronic device 10 can be reduced, it is possible to improve image quality.

Figure 3A:
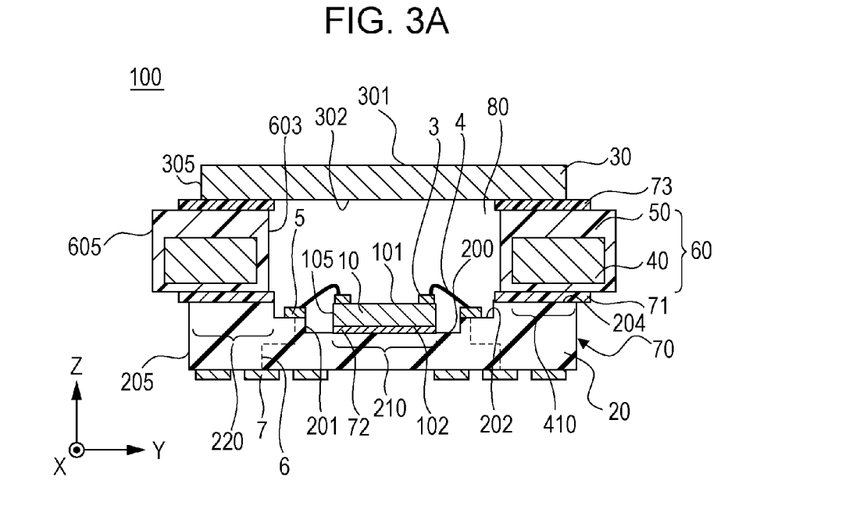
FIGS. 3A and 3B are schematic cross-sectional views of an electronic component according to a second embodiment of the present invention.
Figure 3B:
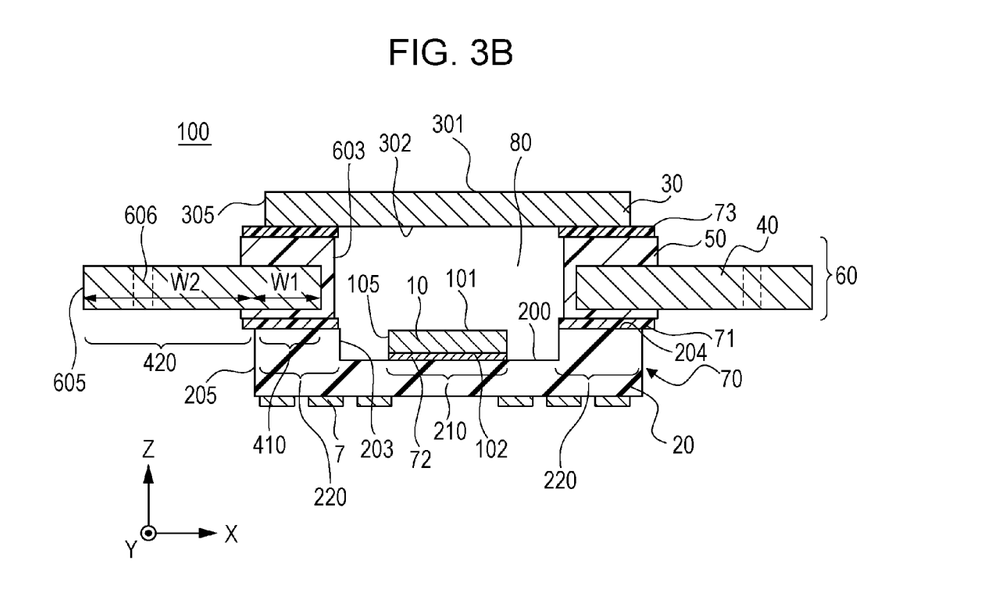

Another example of the electronic component 100 will be described as a second embodiment of the present invention. The second embodiment differs from the first embodiment mainly in the shape of the base 20. The other points are the same as those of the first embodiment and will not be described. FIGS. 3A and 3B illustrate a modification of the electronic component 100, and are cross-sectional views of portions corresponding to those illustrated in FIGS. 2A and 2B.

The modification illustrated in FIGS. 3A and 3B differs from the electronic component 100 of the first embodiment illustrated in FIGS. 2A and 2B in that the base 20 has a recessed portion. Specifically, the intermediate region between the central region 210 and the peripheral region 220 of the base 20 illustrated in FIGS. 3A and 3B has step portions and stepped portions. A step portion is a portion extending in the X-direction and the Y-direction, whereas a stepped portion is a portion located between two step portions of different heights and extending in the Z-direction. Therefore, in the second embodiment, the reference surface 202 in FIGS. 2A and 2B can be referred to as a reference step portion 202. As illustrated in FIGS. 3A and 3B, an upper step portion 204 is located at a position closer to the outer edge of the container 70 (i.e., closer to the outer edge 205 of the base 20) than the inner terminal groups are in the Y-direction. The upper step portion 204 protrudes from the reference step portion 202. That is, in the Z-direction, the upper step portion 204 is closer to the cover 30 than the reference step portion 202 is to the cover 30. A stepped portion 203 is located between the reference step portion 202 and the upper step portion 204. The stepped portion 203 faces the connection conductors 4 across part of the inner space 80.

In the example illustrated in FIGS. 3A and 3B, the base 20 has a lower step portion 200 as well as the reference step portion 202 and the upper step portion 204. The lower step portion 200 is farther from the outer edge 205 of the base 20 than the inner terminal groups are from the outer edge 205. That is, the lower step portion 200 is located inside the inner terminal groups in the base 20. The lower step portion 200 is recessed from the reference step portion 202 via the stepped portion 201. That is, in the Z-direction, the lower step portion 200 is located farther from the cover 30 than the inner terminal groups are from the cover 30, with the stepped portion 201 located between the lower step portion 200 and the inner terminal groups. The stepped portion 201 faces the side face 105 of the electronic device 10 across part of the inner space 80. The reference step portion 202 is located between the upper step portion 204 and the lower step portion 200. Therefore, the reference step portion 202 may be called a middle step portion. As illustrated in FIG. 3B, in the X-direction where there are no inner terminals 5, the reference step portion 202 is not provided between the lower step portion 200 and the upper step portion 204, and the stepped portion 203 is located between the upper step portion 204 and the lower step portion 200. As in the Y-direction, a middle step portion may be provided between the upper step portion 204 and the lower step portion 200 in the X-direction. However, such a middle step portion where there are no inner terminals 5 may not be provided, because the container 70 becomes larger than necessary.

To manufacture a ceramic laminated body having a recessed portion, a plurality of green sheets stamped with a frame die are stacked to form a raw ceramic frame member, as in the case of forming a plate member for the base 20 of the first embodiment. The ceramic laminated body described above can be made by staking and firing the plate member and the frame member. As illustrated in FIGS. 3A and 3B, the ceramic laminated body has a recessed portion having the stepped portion 203 and the stepped portion 201. The stepped portion 203 connects the reference step portion 202 and the upper step portion 204, and the stepped portion 201 connects the reference step portion 202 and the lower step portion 200. The inner terminals 5 are provided on the reference step portion 202. With the present configuration, an electronic component having high heat dissipation performance can be provided, as with the configuration of the first embodiment.

In the second embodiment, as illustrated in FIG. 3A, on the side where the width W2 (see FIG. 3B) of the extended portion 420 is shorter than the width W1 (see FIG. 3B) of the joint portion 410, the outer edge 605 of the frame 60 is formed by the low thermal conductivity member 50. As illustrated in FIG. 3B, on the side where the width W2 of the extended portion 420 is longer than the width W1 of the joint portion 410, the outer edge 605 of the frame 60 is formed by the high thermal conductivity member 40. Of the four sides of the container 70, only the sides where the width W2 of the extended portion 420 is longer than the width W1 of the joint portion 410 are sides where the extended portion 420 is exposed to the outer space. On the sides where the width W2 is shorter than the width W1, it is mainly required to conduct heat not to the outside, but to the extended portion 420 on the sides where the width W2 is longer than the width W1. Therefore, on the sides where the width W2 is shorter than the width W1, the outer edge 605 is thermally insulated from the outer space by the low thermal conductivity member 50. This improves the efficiency of heat dissipation on the sides where the width W2 is longer than the width W1.

Figure 4A:
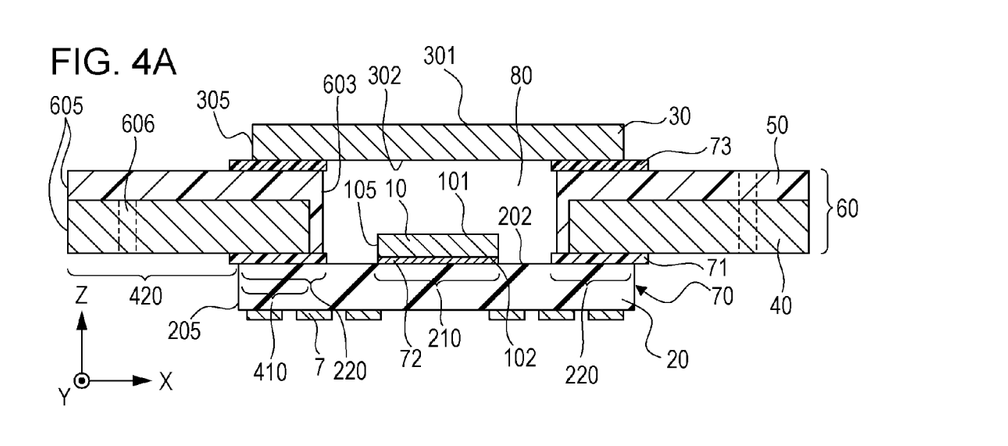
FIGS. 4A to 4C are schematic cross-sectional views of electronic components according to third to fifth embodiments of the present invention.
Figure 4B:
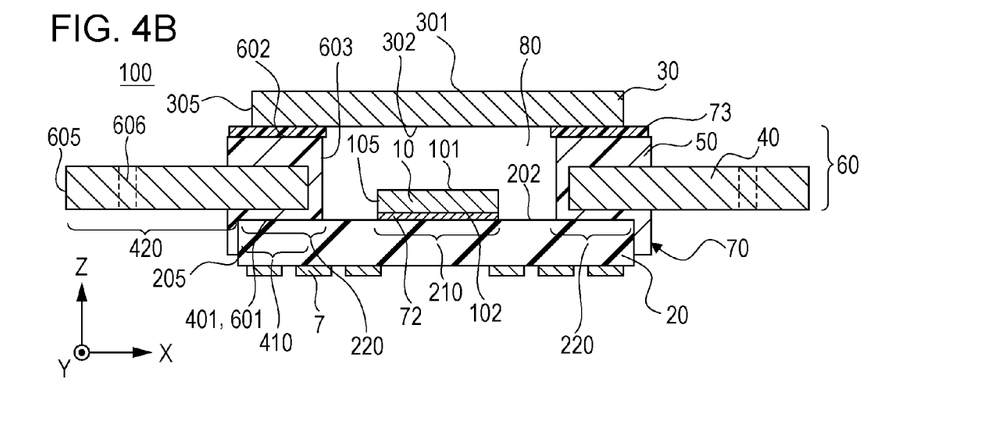
Figure 4C:
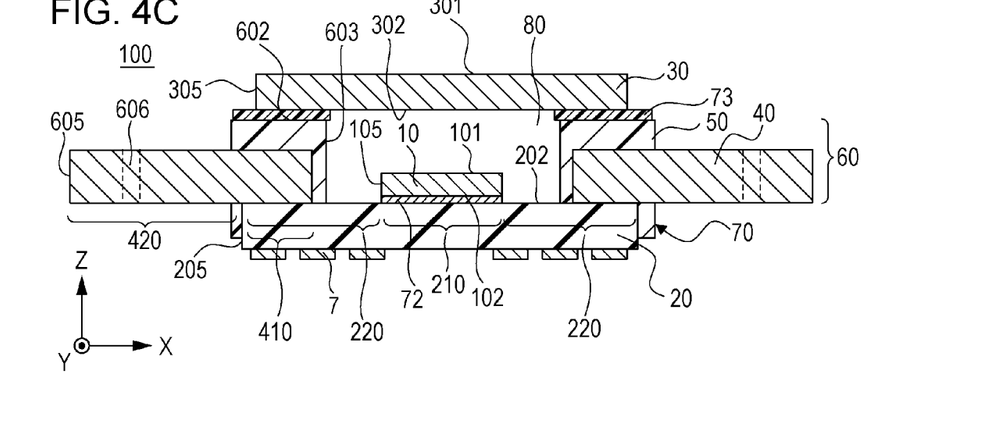

Other examples of the electronic component 100 will now be described as third to fifth embodiments of the present invention. The third to fifth embodiments differ from the first embodiment mainly in the shape of the frame 60. The other points will not be described here, as they are the same as those of the first embodiment. FIGS. 4A, 4B, and 4C are each a cross-sectional view of a portion of the electronic component 100 corresponding to that illustrated in FIG. 2B.

In the third embodiment illustrated in FIG. 4A, the low thermal conductivity member 50 is not located between the high thermal conductivity member 40 and the base 20, and the high thermal conductivity member 40 is in contact with the bonding member 71. That is, the thickness T2 (see FIGS. 2A and 2B) of the low thermal conductivity member 50 adjacent to the base 20 is zero (T2=0).

Also in the third embodiment, the low thermal conductivity member 50 covers not only the upper surface of the joint portion 410 of the high thermal conductivity member 40, but also the upper surface of the extended portion 420. Since the lower surface of the high thermal conductivity member 40 is exposed, heat can be dissipated through the exposed lower surface of the high thermal conductivity member 40 to the outside. Thus, since only the lower surface of the high thermal conductivity member 40 is exposed, it is possible to reduce unnecessary heat dissipation from the upper surface of the high thermal conductivity member 40. Also, when the low thermal conductivity member 50 is made of a black or gray light-absorbing material, it is possible to reduce heat reflection on the upper surface of the frame 60 and improve image quality, as the upper surface of the frame 60 is the light entry side of an image pickup apparatus and is the light exit side of a display apparatus.

In the fourth embodiment illustrated in FIG. 4B, there is no bonding member 71 between the frame 60 and the base 20. The low thermal conductivity member 50 is located between the high thermal conductivity member 40 and the base 20, and is in contact with the base 20. That is, the relationship between the thickness T2 of the low thermal conductivity member 50 adjacent to the base 20 and the distance D1 (see FIGS. 2A and 2B) can be expressed as T2=D1. Thus since no bonding member 71 is provided, heat conduction from the base 20 to the high thermal conductivity member 40 is not interrupted by the bonding member 71, and the efficiency of heat dissipation can be improved. Instead of providing the bonding member 71, the low thermal conductivity member 50 is provided to be in contact with not only the peripheral region 220 of the base 20, but also the outer edge 205 of the base 20. This reduces degradation of the bonding strength between the frame 60 and the base 20 which may be caused by the absence of the bonding member 71.

In the fifth embodiment illustrated in FIG. 4C, neither the bonding member 71 nor the low thermal conductivity member 50 is present between the high thermal conductivity member 40 and the base 20. Then, the high thermal conductivity member 40 is in contact with the base 20. That is, the distance D1 shown in FIGS. 2A and 2B is zero (D1=0). This improves thermal conductivity between the high thermal conductivity member 40 and the base 20. An ultrahigh thermal conductivity member having a thermal conductivity higher than those of the high thermal conductivity member 40 and the base 20 may be provided between the high thermal conductivity member 40 and the base 20, such that both the high thermal conductivity member 40 and the base 20 can be in contact with the ultrahigh thermal conductivity member. This also makes it possible to achieve a high thermal conductivity.

In the structure illustrated in FIG. 4C, the electronic device 10 is secured by bonding to the base 20, which is secured by bonding to the high thermal conductivity member 40. This creates a heat dissipation path running from the electronic device 10 through the base 20 to the high thermal conductivity member 40. Additionally, part of the high thermal conductivity member 40 has a metal exposed surface in the extended portion 420. This allows direct connection to a heat dissipating body, such as a camera body, and improves the heat dissipation performance.

A method for manufacturing an example of the electronic component 100 will be described as a sixth embodiment of the present invention. FIGS. 5A to 5D and FIGS. 6E to 6H are each a schematic cross-sectional view corresponding to that taken along line IIA-IIA of FIGS. 1A and 1B. As can be seen from FIGS. 5A to 5D and FIGS. 6E to 6H, the electronic component 100 is obtained by stacking the electronic device 10, the base 20, the frame 60 composed of the high thermal conductivity member 40 and the low thermal conductivity member 50 prepared in advance in the Z-direction.

Figure 5A:
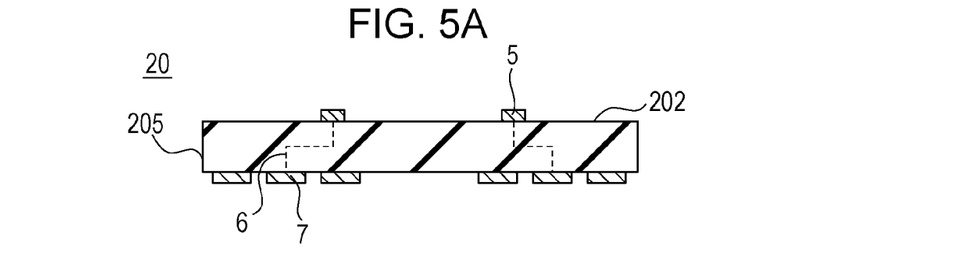
FIGS. 5A to 5D are schematic cross-sectional views illustrating an electronic component manufacturing method according to a sixth embodiment of the present invention.

FIG. 5A illustrates step A for preparing the base 20. As described above, the base 20 has the inner terminals 5, the embedded portions 6, and the outer terminals 7. The base 20 has the reference surface 202, on which the inner terminals 5 are provided.

The base 20 is a raw ceramic plate obtained by stacking a plurality of green sheets formed by a sheet forming method, such as a doctor blade method or a calendering roll method, and stamped with a plate die.

The inner terminals 5, the embedded portions 6, and the outer terminals 7 can be obtained by firing a conductive paste pattern formed by screen printing or the like in the process of stacking green sheets.

Figure 5B:
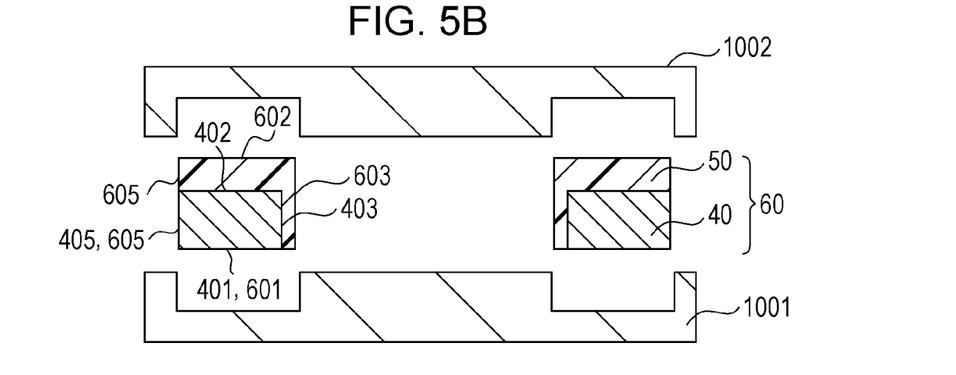

FIG. 5B illustrates step B for preparing the frame 60. First, the high thermal conductivity member 40 having a frame-like shape is placed between a metal mold 1001 and a metal mold 1002. The high thermal conductivity member 40 has a lower surface 401 to be located adjacent to the base 20 and an upper surface 402 to be located adjacent to the cover 30. The frame-like high thermal conductivity member 40 also has an inner edge 403 and an outer edge 405.

By a resin molding method, such as a transfer molding method using the metal molds 1001 and 1002, the low thermal conductivity member 50 made of resin is formed to be firmly attached to the surface of the high thermal conductivity member 40. Thus, the frame 60 having the high thermal conductivity member 40 and the low thermal conductivity member 50 is made. In the present embodiment, the low thermal conductivity member 50 is formed on the upper surface 402 of the high thermal conductivity member 40 to form an upper surface 602 of the frame 60. At the same time, the low thermal conductivity member 50 is formed on the inner edge 403 of the high thermal conductivity member 40 to form the inner edge 603 of the frame 60.

Figure 5C:
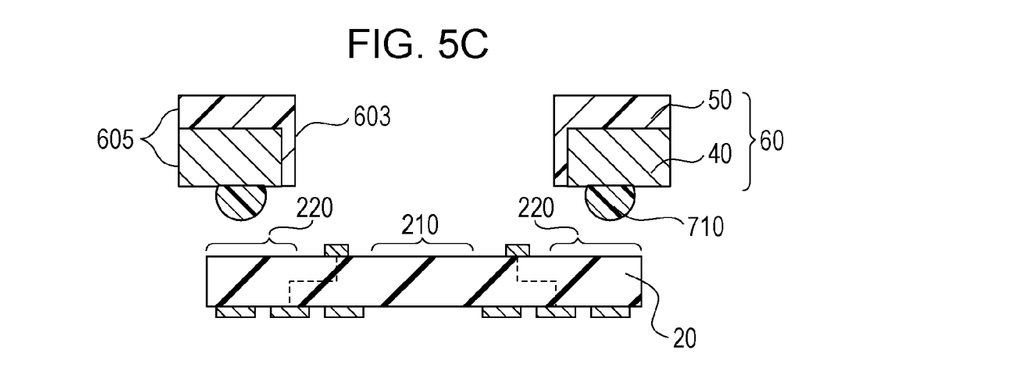

FIG. 5C illustrates step C for bonding the base 20 and the frame 60. An adhesive 710 is applied to at least one of the peripheral region 220 of the base 20 and the frame 60 (the frame 60 in the present embodiment). As illustrated in FIG. 5C, the adhesive 710 may be applied only to a lower surface 601 of the frame 60. This is because the frame 60 is flatter than the base 20 and it is easier to control the amount of the adhesive 710 to be applied to the frame 60. A thermosetting resin is typically used as the adhesive 710. A printing method or a dispensing method may be used to apply the adhesive 710.

Figure 5D:
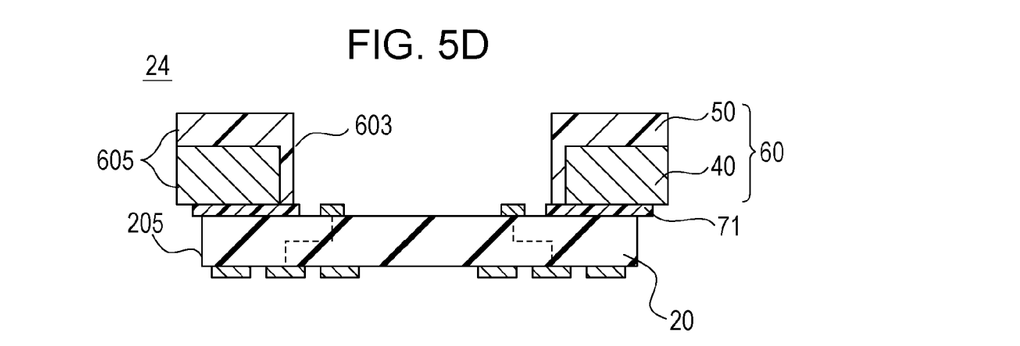

FIG. 5D illustrates another step D for bonding the base 20 and the frame 60. The frame 60 is placed over the peripheral region 220 of the base 20. Then, the applied adhesive 710 is solidified by an appropriate method. The adhesive 710, which may be a thermosetting resin, is cured by heat. Thus, the adhesive 710, which is a liquid, turns into the bonding member 71, which is a solid. The frame 60 and the base 20 are thus bonded together, with the bonding member 71 interposed therebetween. In the high thermal conductivity member 40 of the frame 60, the joint portion 410 and the extended portion 420 are created. The joint portion 410 is located on a side of the inner edge 603 of the frame 60 than the outer edge 205 of the base 20 and bonded to the base 20. The extended portion 420 is located on a side of the outer edge 605 of the frame 60 than the outer edge 205 of the base 20. Thus, a mounting member 24 having the frame 60 and the base 20 is manufactured.

Figure 6E:
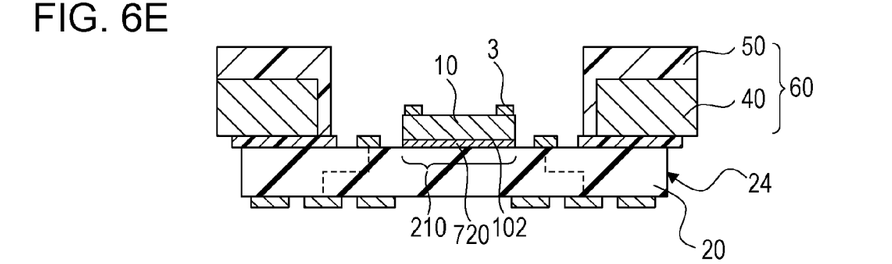
FIGS. 6E to 6H are schematic cross-sectional views illustrating the electronic component manufacturing method according to the sixth embodiment.
Figure 6F:
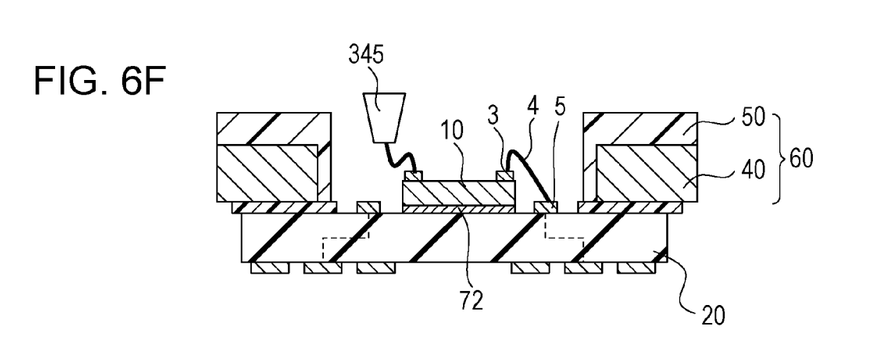

FIG. 6E illustrates step E for securing the electronic device 10 to the base 20. The electronic device 10 has the electrodes 3. An adhesive 720, such as a die bonding paste, is applied to at least one of the central region 210 of the base 20 and the back surface 102 of the electronic device 10 (typically only to the central region 210 of the base 20). Then the electronic device 10 is placed on the adhesive 720. As illustrated in FIG. 6F, the adhesive 720 is then solidified into the bonding member 72, so that the electronic device 10 and the base 20 are bonded together.

FIG. 6F illustrates step F for electrically connecting the electronic device 10 and the base 20. Wire bonding connection is used in the present embodiment. After one end of a metal wire fed from a capillary 345 is connected to an electrode 3, the other end of the metal wire is connected to the corresponding inner terminal 5. This metal wire forms a connection conductor 4. When flip-chip connection is used, bumps may serve both as the bonding member 72 and the connection conductors 4.

Figure 6G:
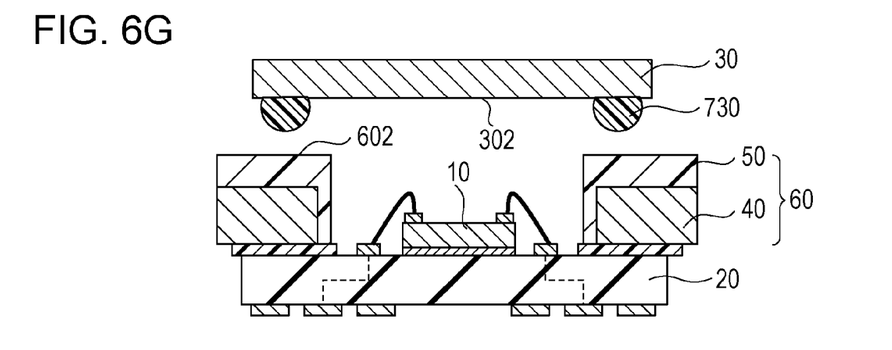

FIG. 6G illustrates step G for bonding the cover 30 to the frame 60. FIG. 6G illustrates a state after all the inner terminals 5 and all the electrodes 3 are connected to each other by the connection conductors 4. An adhesive 730 is applied to at least one of the upper surface 602 of the frame 60 and the inner surface 302 of the cover 30 (the inner surface 302 in the present embodiment). As illustrated in FIG. 6G, the adhesive 730 may be applied only to the inner surface 302 of the cover 30. This is because the cover 30 is flatter than the frame 60 and it is easier to control the amount of the adhesive 730 to be applied to the cover 30. A photo-curable resin is typically used as the adhesive 730. A printing method or a dispensing method may be used to apply the adhesive 730.

Figure 6H:
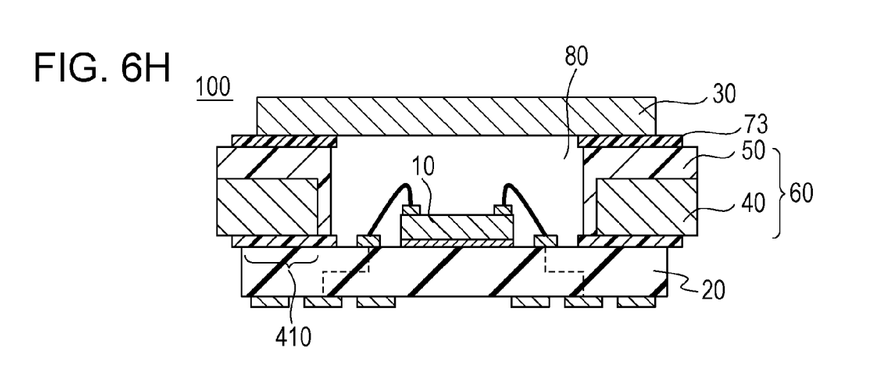

FIG. 6H illustrates another step H for bonding the cover 30 to the frame 60. The cover 30 is placed over the joint portion 410 of the frame 60. The adhesive 730 is obviously a liquid at this point. Therefore, when the cover 30 is pressed against the frame 60 by its weight or pressure, an excess of the adhesive 730 is squeezed out of the space between the frame 60 and the cover 30. Then, the applied adhesive 730 is solidified by an appropriate method. Thus, the adhesive 730, which is a liquid, turns into the bonding member 73, which is a solid. The frame 60 and the cover 30 are thus bonded together, with the bonding member 73 interposed therebetween. A photo-curable resin is used as the adhesive 730 for the following reason. When the adhesive 730 is applied to the entire perimeter of the bonding surface, if a thermosetting adhesive is used as the adhesive 730, the inner space 80 may be thermally expanded during heating, so that the adhesive 730 in a liquid state may be squeezed out by the internal pressure. Using a photo-curable adhesive as the adhesive 730 makes it possible to avoid this. Note that after a photo-curable adhesive is semi-cured by photo-curing, thermosetting may be additionally used as a post-curing method. For using the photo-curable adhesive 730, the cover 30 may be sufficiently light-transmissive for a wavelength, such as an ultraviolet wavelength, to which the adhesive 730 reacts. The electronic component 100 can thus be manufactured.

In the steps described above, the base 20 and the frame 60 may be bonded together by the bonding member 71 along the entire perimeter of the bonding surface. Also, the cover 30 and the frame 60 may be bonded together by the bonding member 73 along the entire perimeter of the bonding surface. When the components are thus bonded together along the entire perimeter, and the inner space 80 around the electronic device 10 is airtight against the outside, it is possible to reduce entry of foreign matter into the inner space 80 and improve reliability. A sufficient amount of adhesive may be used to ensure airtightness.

Figure 7A:
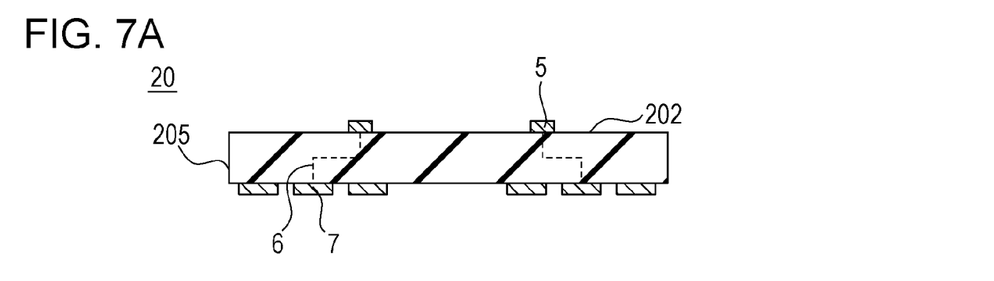
FIGS. 7A to 7C are schematic cross-sectional views illustrating an electronic component manufacturing method according to a seventh embodiment of the present invention.
Figure 7B:
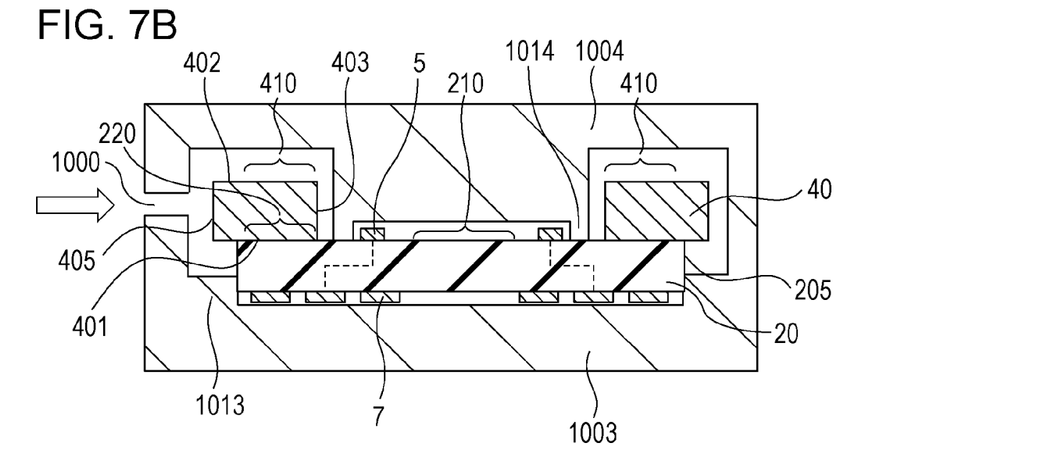
Figure 7C:
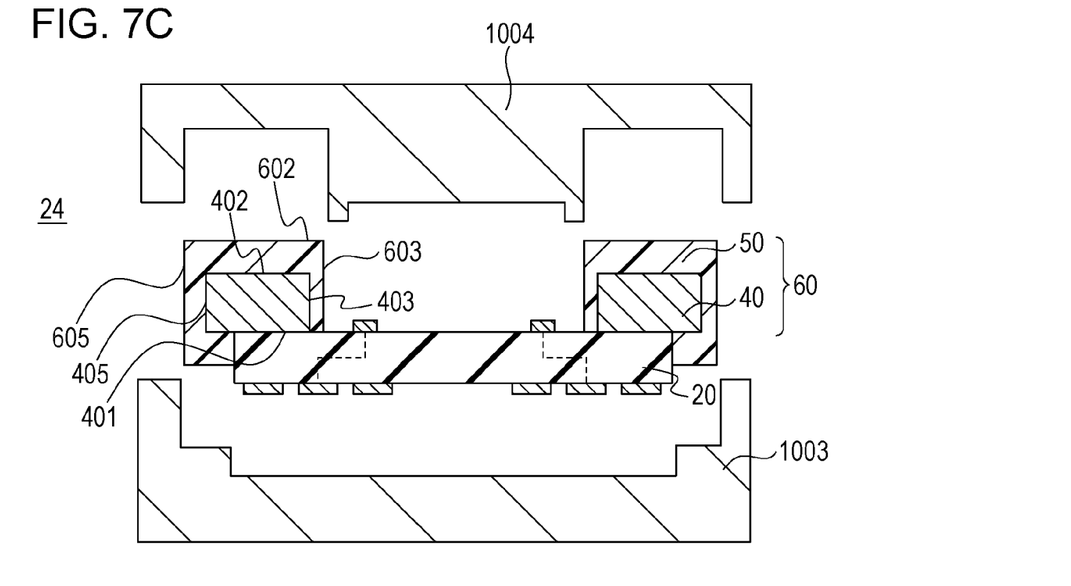

A method for manufacturing another example of the electronic component 100 will be described as a seventh embodiment of the present invention. FIGS. 7A to 7C are each a schematic cross-sectional view corresponding to that taken along line IIA-IIA of FIGS. 1A and 1B.

FIG. 7A illustrates step A for preparing the base 20. As described above, the base 20 has the inner terminals 5, the embedded portions 6, and the outer terminals 7. The base 20 has the reference surface 202, on which the inner terminals 5 are provided. The method for forming the base 20 is the same as that described in the first embodiment.

FIG. 7B illustrates step B for positioning the high thermal conductivity member 40 on the peripheral region 220 of the base 20. The high thermal conductivity member 40 to be included in the frame 60 is prepared and brought into contact with the upper part of the peripheral region 220 of the base 20. The high thermal conductivity member 40 is placed on the base 20 to have the joint portion 410 and the extended portion 420 (not shown). The high thermal conductivity member 40 has the lower surface 401 to be located adjacent to the base 20 and the upper surface 402 to be located adjacent to the cover 30. The high thermal conductivity member 40 also has the inner edge 403 and the outer edge 405. The lower surface 401 is in contact with the peripheral region 220 of the base 20.

The positioning of the base 20 and the high thermal conductivity member 40 takes place between a metal mold 1003 and a metal mold 1004. The metal molds 1003 and 1004 have raised and recessed portions corresponding to the shape of the low thermal conductivity member 50 made of resin (described below). The metal mold 1003 has a partition 1013 that isolates the outer terminals 7 from the low thermal conductivity member 50 to prevent mold resin from adhering to the outer terminals 7. The metal mold 1004 has a partition 1014 that isolates the inner terminals 5 and the central region 210 from the mold resin to prevent the mold resin from adhering to the inner terminals 5 and the central region 210.

After the high thermal conductivity member 40 is brought into contact with the base 20 in step B, a resin is injected through an injection port 1000 into the space between the metal molds 1003 and 1004. By a resin molding method, such as a transfer molding method, as illustrated in FIG. 7C, the low thermal conductivity member 50 made of resin is formed to be firmly attached to the surface of the high thermal conductivity member 40. Also, the low thermal conductivity member 50 is formed to be in contact with the base 20. Thus, the frame 60 can be formed and secured to the base 20 at the same time.

As illustrated in FIG. 7C, the low thermal conductivity member 50 formed to cover the upper surface 402 of the high thermal conductivity member 40 forms the upper surface 602 of the frame 60. The low thermal conductivity member 50 formed to cover the inner edge 403 of the high thermal conductivity member 40 forms the inner edge 603 of the frame 60. The low thermal conductivity member 50 formed to cover the outer edge 405 of the high thermal conductivity member 40 forms the outer edge 605 of the frame 60. Additionally, the low thermal conductivity member 50 is formed to cover the outer edge 205 of the base 20. This enhances the bonding strength between the frame 60 and the base 20.

The partitions 1013 and 1014 prevent the low thermal conductivity member 50 from covering the outer terminals 7, the inner terminals 5, and the central region 210. Therefore, when the electronic device 10 is placed later on, the low thermal conductivity member 50 does not extend between the electronic device 10 and the central region 210. Also, it is possible to reduce poor connection of the outer terminals 7 and the inner terminals 5.

The subsequent manufacturing steps will not be described here, as they can be carried out in the same manner as that described with reference to FIGS. 6E to 6H.

In the present embodiment, where the bonding member 71 is not provided between the base 20 and the frame 60, the electronic component 100 having heat dissipation efficiency higher than that in the case with the bonding member 71 can be provided.

Since the bonding member 71 is not provided between the base 20 and the frame 60, and the base 20 and the frame 60 are integrally molded of resin into one piece, the bonding reliability between the base 20 and the frame 60 can be improved. Additionally, since there is no need to carry out the steps of applying, bonding, and curing the bonding member 71, it is possible to reduce the cost and process involved in forming the bonding member 71.

The first to seventh embodiments have been described. The present invention further includes mounted components, electronic components, electronic apparatuses, and their manufacturing methods obtained by combining some of the embodiments described above.

The present invention makes it possible to provide an electronic component having high heat dissipation performance.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-222521 filed Oct. 25, 2013, which is hereby incorporated by reference herein in its entirety.

What is claimed is:

1. An electronic component comprising:
an electronic device; and
a container configured to contain the electronic device,
wherein the container includes a base having a first region to which the electronic device is secured and a second region around the first region, a cover facing the electronic device across a space, and a frame secured to the second region to surround the space;
the frame includes a first member and a second member having a thermal conductivity lower than those of the first member and the base;
the first member includes, in a first direction from an inner edge of the frame to an outer edge of the frame, a first portion located on a side of the inner edge of the frame than an outer edge of the base, and a second portion located on a side of the outer edge of the frame than the outer edge of the base, the first portion being located between the second region and the cover in a second direction from the base to the cover; and the second member is located between the cover and the first portion, and a shortest distance between the first portion and the cover is larger than a shortest distance between the first portion and the base and is smaller than a length of the first portion in the second direction.

2. The electronic component according to claim 1, wherein a length of the second portion is longer than a length of the first portion in a direction from the inner edge of the frame to the outer edge of the frame.

3. The electronic component according to claim 1, wherein a shortest distance between the electronic device and the first region is smaller than a shortest distance between the cover and the frame.

4. The electronic component according to claim 1, wherein the second member does not extend between the electronic device and the first region.

5. The electronic component according to claim 1, wherein the frame is secured to the base, with a bonding member interposed between the first member and the base.

6. The electronic component according to claim 1, wherein the base includes an insulator, and the first portion is in contact with the insulator of the base.

7. The electronic component according to claim 1, wherein the base includes an insulator;

the container has inner terminals connected to the electronic device, and outer terminals electrically connected via respective embedded portions embedded in the base to the respective inner terminals, the outer terminals being exposed to an outside of the container; and the outer terminals are located in a region of orthogonal projection from the cover to the base.

8. The electronic component according to claim 1, wherein the second portion is exposed to an outside of the container.

9. The electronic component according to claim 1, wherein the second portion has at least one through hole.

10. The electronic component according to claim 1, wherein the inner edge of the frame is formed by the second member.

11. The electronic component according to claim 1, wherein in the second direction, a length of the first member is longer than a length of the second member between the first member and the cover.

12. The electronic component according to claim 1, wherein the cover is secured to the frame, with a bonding member interposed between the second member and the cover.

13. The electronic component according to claim 1, wherein the first member is made of metal, the second member is made of resin, the base is made of ceramic, and the cover is made of glass or a single-crystal material.

14. The electronic component according to claim 1, wherein a Young's modulus of the second member is lower than a Young's modulus of the first member.

15. The electronic component according to claim 1, wherein the electronic device is an image pickup device or a display device, and the cover is transparent to visible light.

16. An electronic apparatus comprising:

the electronic component according to claim 1; and a housing to which the second portion is secured.

17. A method for manufacturing the electronic component according to claim 1, the method comprising forming the frame with a resin molding method.

18. The electronic component according to claim 1, wherein the base includes an insulator, the second member is in contact with at least a portion of the outer edge of the base, and the portion of the outer edge is formed by the insulator.

19. The electronic component according to claim 1, wherein the second member extends between the first member and the second region.

20. A method for manufacturing the electronic component according to claim 1, the method comprising forming the frame with a resin molding method by taking place the first member and the base between molds.

* * * * *